(12) United States Patent
Gatzemeier et al.

(10) Patent No.: US 8,094,508 B2
(45) Date of Patent: Jan. 10, 2012

(54) MEMORY BLOCK TESTING

(75) Inventors: Scott N. Gatzemeier, Boise, ID (US);
Joemar Sinipete, Boise, ID (US); Nevil Gajera, Boise, ID (US); Mark Hawes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 344 days.

(21) Appl. No.: 12/509,739

(22) Filed: Jul. 27, 2009

(65) Prior Publication Data

US 2009/0290441 A1    Nov. 26, 2009

Related U.S. Application Data

(62) Division of application No. 11/402,534, filed on Apr. 12, 2006, now Pat. No. 7,567,472.

(51) Int. Cl.
*G11C 7/00* (2006.01)
(52) U.S. Cl. ........................................ 365/201
(58) Field of Classification Search ............ 365/201
See application file for complete search history.

(56) References Cited

U.S. PATENT DOCUMENTS

| 5,321,699 | A | 6/1994 | Endoh et al. |
| 5,477,495 | A | 12/1995 | Tanaka et al. |
| 6,131,139 | A | 10/2000 | Kikuchi et al. |
| 6,222,779 | B1 | 4/2001 | Saito et al. |
| 6,966,016 | B2 | 11/2005 | Naksrikram et al. |
| 2005/0169057 | A1 | 8/2005 | Shibata et al. |
| 2006/0098489 | A1 | 5/2006 | Inoue et al. |
| 2007/0136628 | A1* | 6/2007 | Doi et al. ................ 714/718 |

* cited by examiner

*Primary Examiner* — Amir Zarabian
*Assistant Examiner* — Anthan Tran
(74) *Attorney, Agent, or Firm* — Leffert Jay & Polglaze, P.A.

(57) ABSTRACT

A memory block of a memory device is tested by programming a plurality of pages of the memory block, passing the memory block if a number of pages, each programmed in a first programming time, is greater than or equal to a first predetermined number and a number of pages, each programmed in a second programming time, is less than or equal to a second predetermined number, and failing the memory block if a programming time of any one of the pages exceeds a predetermined programming time or if the number of pages programmed in the first programming time is less than the first predetermined number or if the number of pages programmed in the second programming time exceeds the second predetermined number.

21 Claims, 5 Drawing Sheets

MEMORY BLOCK TESTING

RELATED APPLICATION

This application is a divisional of U.S. application Ser. No. 11/402,534, titled "MEMORY BLOCK TESTING," filed Apr. 12, 2006 (allowed) now U.S. Pat. No. 7,567,472, which application is commonly assigned and incorporated herein by reference.

FIELD

The present invention relates generally to memory devices and in particular the present invention relates to memory block testing.

BACKGROUND

Memory devices, such as NAND or NOR flash memory devices, dynamic random access memory devices (DRAMs), static random access memory device (SRAMs), or the like, are generally fabricated on semiconductor wafers. Each of these wafers typically contains a number of individual integrated circuit memory devices formed in rectangular areas known as dies. After fabrication, each die is separated, or diced, then packaged in a format suitable for the end user.

Before or after dicing and packaging, a manufacturer may test its integrated circuit devices as part of a quality program to improve end-use reliability. Such tests are generally performed on highly-specialized testing systems or tester hardware. Prior to dicing, tests may be performed by the testing system on each die of a semiconductor wafer in pattern. The tester hardware may test each die individually or it may test multiple dies concurrently. Subsequent to dicing, tests may be performed by the testing system on multiple packaged components in pattern. The tester hardware may test each component individually or it may test multiple components concurrently.

A typical NAND flash memory comprises a memory array that includes a large number of memory cells arranged in row and column fashion. Each of the memory cells includes a floating-gate field-effect transistor capable of holding a charge. The cells are usually grouped into blocks, e.g., 2048 blocks. Each block includes a number of rows, e.g., 32 rows, and each row may include one or more pages, e.g., two pages. Each of the cells within a block can be electrically programmed on an individual basis by charging the floating gate. The charge can be removed from the floating gate by a block erase operation. The data in a cell is determined by the presence or absence of the charge on the floating gate.

To guarantee the programming speed of a memory device to a customer, typical test methods usually involve determining a time it takes to program each page and comparing that time to a predetermined acceptable programming time for a page. For some conventional test methods, if the programming time for any one of the pages is longer than the predetermined acceptable programming time, the entire block is failed and is repaired. That is, an entire block may be failed and subsequently repaired for just one slow block. Such repairs increase manufacturing times that result in reduced yields. Moreover, the frequency of the repairs is highly dependent on variations in the fabrication process.

For the reasons stated above, and for other reasons stated below which will become apparent to those skilled in the art upon reading and understanding the present specification, there is a need in the art for alternative test methods for determining programming speeds.

DETAILED DESCRIPTION

Figure 1:
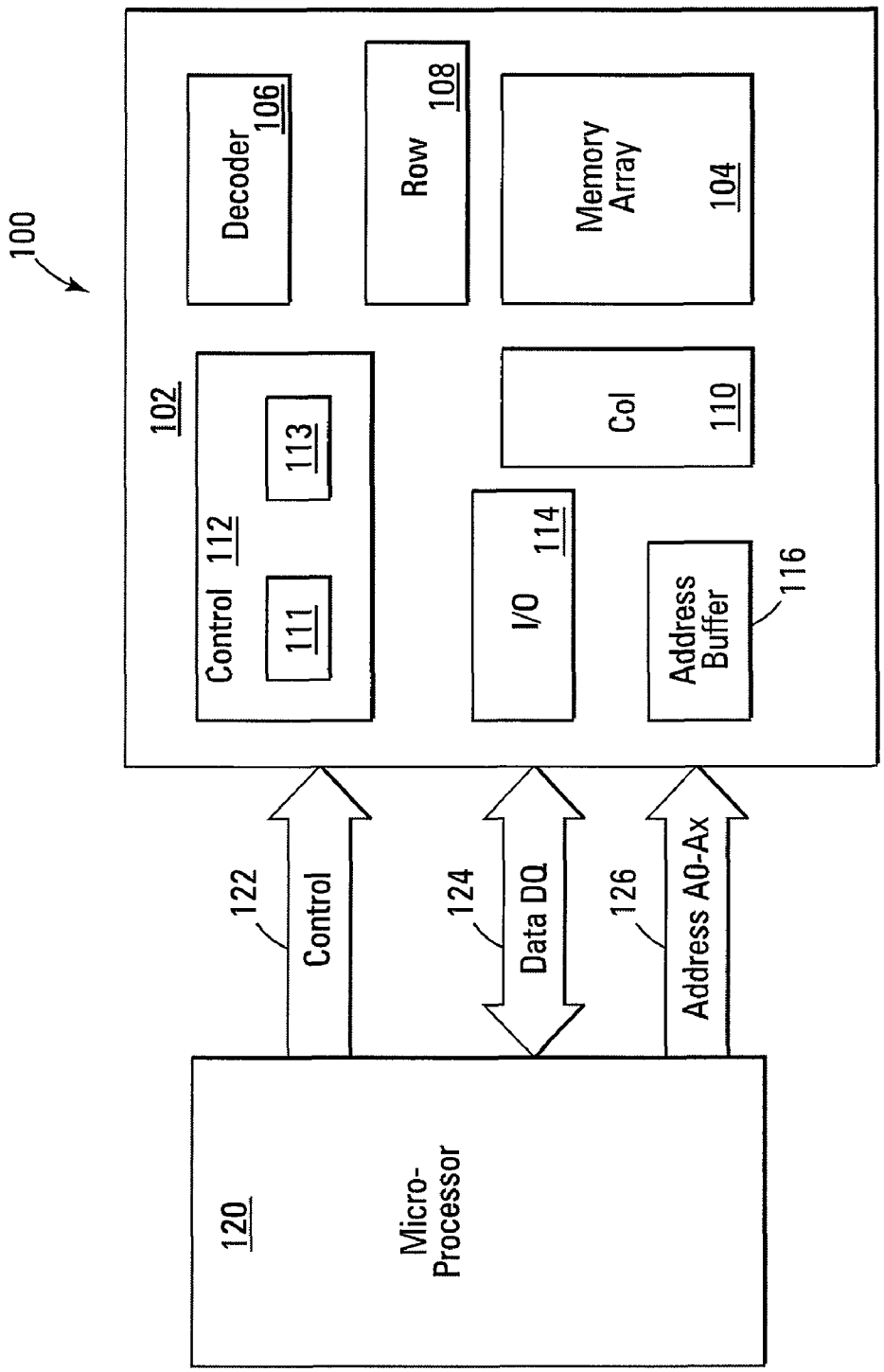
FIG. 1 illustrates a block diagram of a memory device in accordance with one embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of a memory device 102 in accordance with one embodiment of the invention. The memory device 102 may be fabricated as an integrated circuit or semiconductor device on a semiconductor die of a semiconductor wafer. FIG. 1 further shows that the memory device 102 may be coupled to a processor 120 to form part of an electronic system 100. Examples of electronic systems 100 include such systems as computer systems, peripheral devices, cellular and wireless devices, digital cameras, audio recorders, personal digital assistants (PDAs), and test equipment. For one embodiment, the processor 120 may be part of a testing system or tester hardware with the memory device 102 being the device under test. For this embodiment, the processor 120 provides address signals, data signals, and control signals to the memory device 102 through multiple leads acting as address lines, data lines, and control lines. Regardless of whether the memory device 102 is an active component of the electronic system 100 or a device under test in the electronic system 100, the processor 120 may be coupled to more than one memory device 102.

For one embodiment memory device 102 may be a NAND memory device or the like that includes an array of flash memory cells 104, e.g., floating-gate memory cells, an address decoder 106, row access circuitry 108, column access circuitry 110, Input/Output (I/O) circuitry 114, and an address buffer 116. Command execution logic 111 is provided to control the basic operations of the memory device 102 in response to control signals received via control signal connections 122. A state machine 113 may also be provided to control specific operations performed on the memory array and the memory cells. The command execution logic 111 and/or state machine 113 can be generally referred to as control circuitry 112 to control read, write, erase, and other memory operations. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

For one embodiment, command execution logic 111 includes trim circuitry (not shown) that may include fusible elements, such as fuses and/or anti-fuses, and/or other non-volatile storage elements adapted to store control parameter values used by state machine 113 for controlling operations on memory blocks of memory array 104. Such control parameters may include, for example, parameters for adjusting the magnitude and duration of voltage pulses applied to the memory blocks, or portions thereof, for carrying out programming and erasing operations.

For another embodiment, processor 120 is adapted to perform methods in accordance with embodiments of the present invention in response to computer-readable instructions. These computer-readable instructions are stored on a computer-usable media and may be in the form of software, firmware, or hardware. In a hardware solution, the instructions are hard coded as part of processor 120, e.g., an application-specific integrated circuit (ASIC) chip, a field programmable gate array (FPGA), etc. In a software or firmware solution, the instructions are stored for retrieval by processor 120. Some additional examples of computer-usable media include static or dynamic random access memory (SRAM or DRAM), read-only memory (ROM), electrically-erasable programmable ROM (EEPROM or flash memory), magnetic media and optical media, whether permanent or removable.

Figure 2:
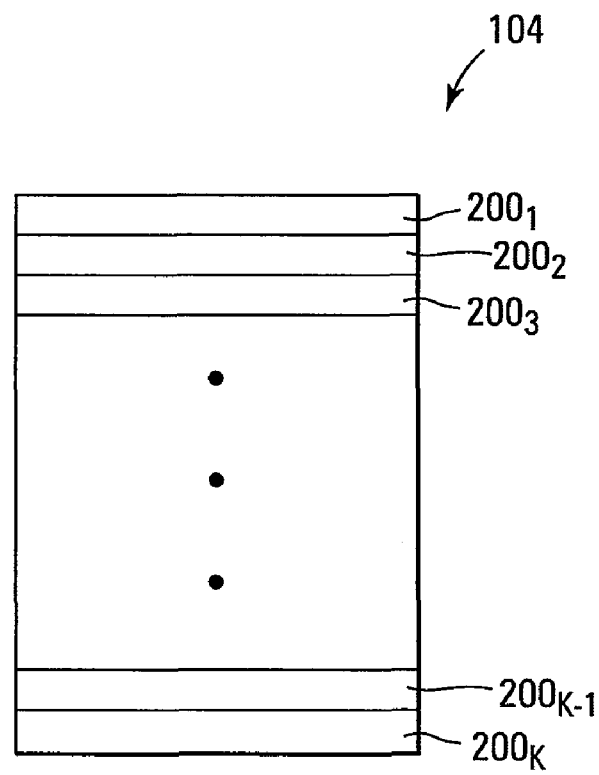
FIG. 2 illustrates a layout of memory array, according to another embodiment of the invention.
Figure 3:
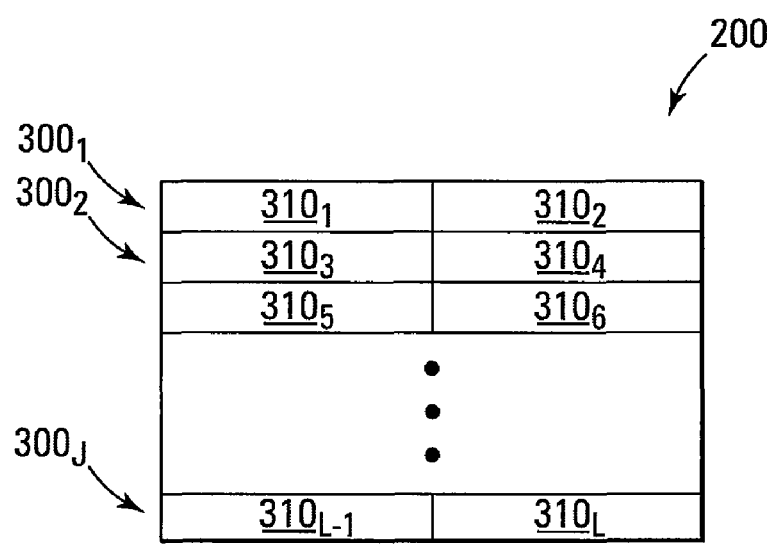
FIG. 3 illustrates a memory block, according to another embodiment of the invention.

FIG. 2 illustrates a layout of memory array 104, according to another embodiment of the invention. Memory array 104 includes memory blocks 200. Each of memory blocks 200 includes rows 300 of memory cells, as shown in FIG. 3, according to another embodiment of the invention. For one embodiment, each row 300 may include one or more pages 310.

Figure 4:
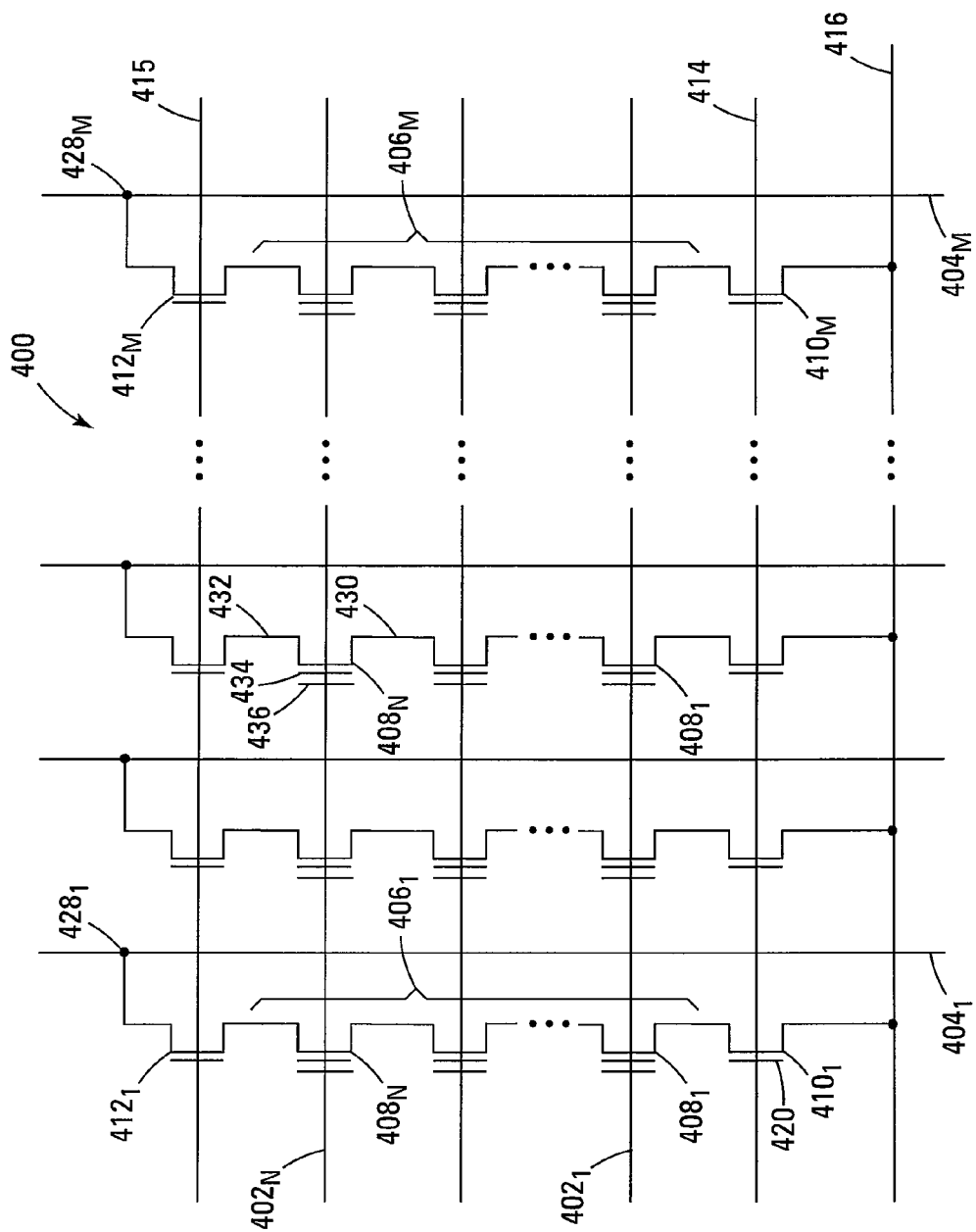
FIG. 4 is a schematic of a NAND memory array in accordance with another embodiment of the invention.

FIG. 4 illustrates a NAND memory array 400 as a portion of a memory block 200 in accordance with another embodiment of the invention. As shown in FIG. 4, the memory array 400 includes word lines $402_1$ to $402_N$ and intersecting local bit lines $404_1$ to $404_M$. For ease of addressing in the digital environment, the number of word lines 402 and the number of bit lines 404 are each some power of two, e.g., 256 word lines 402 by 4,096 bit lines 404. The local bit lines 404 are coupled to global bit lines (not shown) in a many-to-one relationship.

Memory array 400 includes NAND strings $406_1$ to $406_M$. Each NAND string includes floating-gate transistors $408_1$ to $408_N$, each located at an intersection of a word line 402 and a local bit line 404. The floating-gate transistors 408 represent non-volatile memory cells for storage of data. The floating-gate transistors 408 of each NAND string 406 are connected in series, source to drain, between a source select line 414 and a drain select line 415. Source select line 414 includes a source select gate 410, e.g., a field-effect transistor (FET), at each intersection between a NAND string 406 and source select line 414, and drain select line 415 includes a drain select gate 412, e.g., a field-effect transistor (FET), at each intersection between a NAND string 406 and drain select line 415. In this way, the floating-gate transistors 408 of each NAND string 406 are connected between a source select gate 410 and a drain select gate 412.

A source of each source select gate 410 is connected to a common source line 416. The drain of each source select gate 410 is connected to the source of the first floating-gate transistor 408 of the corresponding NAND string 406. For example, the drain of source select gate $410_1$ is connected to the source of floating-gate transistor $408_1$ of the corresponding NAND string $406_1$. Each source select gate 410 includes a control gate 420.

The drain of each drain select gate 412 is connected to the local bit line 404 for the corresponding NAND string at a drain contact 428. For example, the drain of drain select gate $412_1$ is connected to the local bit line $404_1$ for the corresponding NAND string $406_1$ at drain contact $428_1$. The source of each drain select gate 412 is connected to the drain of the last floating-gate transistor $408_N$ of the corresponding NAND string 406. For example, the source of drain select gate $412_1$ is connected to the drain of floating-gate transistor $408_N$ of the corresponding NAND string $406_1$.

Typical construction of floating-gate transistors 408 includes a source 430 and a drain 432, a floating gate 434, and a control gate 436, as shown in FIG. 4. Floating-gate transistors 408 have their control gates 436 coupled to a word line 402. A column of memory array 400 includes a NAND string 406 and the source and drain select gates connected thereto. A row of the floating-gate transistors 408 are those transistors commonly coupled to a given word line 402.

Figure 5:
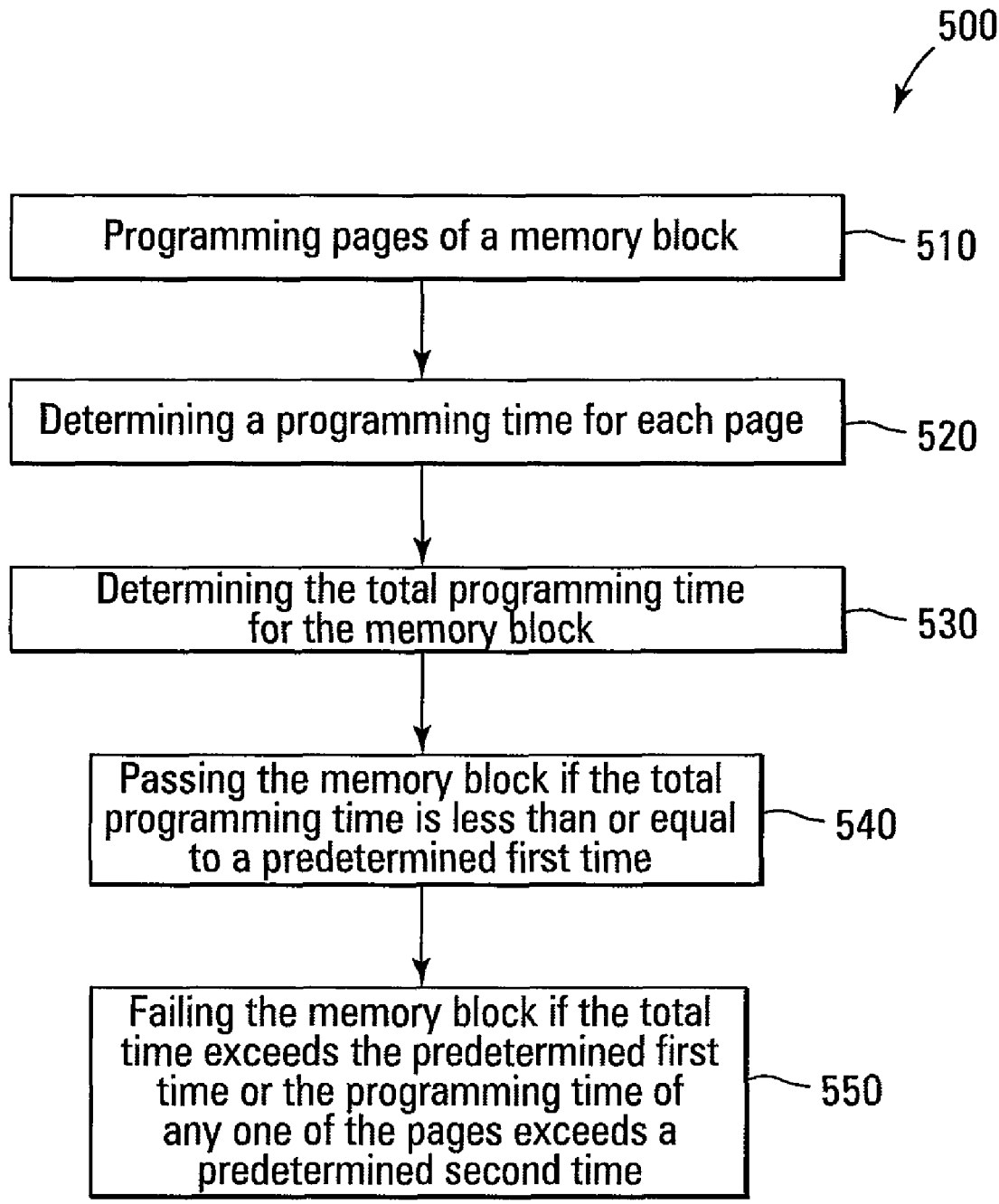
FIG. 5 is a flowchart of a test method, according to another embodiment of the invention.

FIG. 5 is a flowchart of a test method 500, according to another embodiment of the invention, for determining a programming time for a memory block, such as a memory block 200 of FIGS. 2 and 3 of a memory device, such as memory device 102 of FIG. 1. For one embodiment, processor 120, as part of a testing system or tester hardware, may perform test method 500. For another embodiment, prior to performing test method 500, memory blocks of the memory device are programmed based on calculated corrected values of the control parameters stored in the trim circuitry of the memory device. After this programming step, the memory blocks are fully erased, and any memory blocks that could not be erased are repaired or marked.

At block 510, each page of a memory block is programmed using one or more programming cycles that may include applying a programming voltage and subsequently performing a program verify to determine whether the page is programmed correctly. After programming the pages of the memory block, a programming time for each page is determined at block 520, and a total programming time for the memory block is determined at block 530. For one embodiment, the programming time for each page and the total programming time for the memory block each correspond to a number of programming cycles. If the total programming time (or total number of programming cycles) for the memory block is less that or equal to a first predetermined time (or number of programming cycles), the memory block is passed at block 540. If the total programming time for the memory block exceeds the first predetermined time (or number of programming cycles) or a programming time (or number of programming cycles) for any one of the pages exceeds a second predetermined time (or number of programming cycles), the memory block is failed at block 550.

Figure 6:
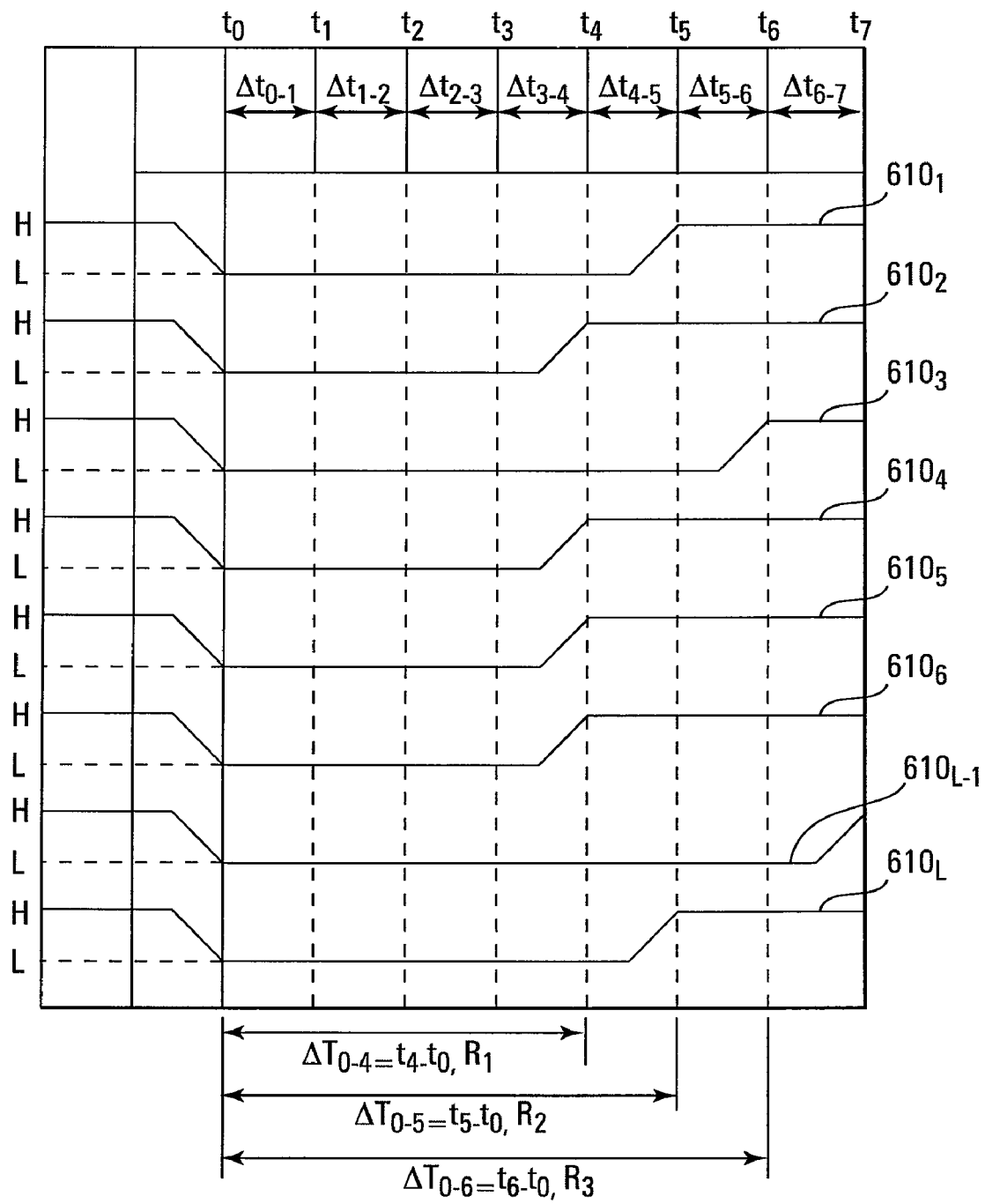
FIG. 6 illustrates exemplary plots of program status signals, according to an embodiment of the invention.

FIG. 6 illustrates exemplary plots of program status signals $610_1$-$610_L$ respectively for the programming of pages $310_1$-$310_L$ of FIG. 3. Program status signals 610 are received at processor 120 over data (DQ) link 124 (FIG. 1) during a programming test performed on memory device 102, according to an embodiment of the invention. For one embodiment, when a status signal 610 transitions from a first logic level, e.g., a logic high level (H) (or a logic 1) to a second logic level, e.g., a logic low level (L) (or a logic 0), a programming operation on a corresponding page 310 is activated, and when the status signal 610 transitions from the second logic level to the first logic level, the corresponding page 310 is programmed.

For another embodiment, a time period $\Delta t$ between successive times t, such as $\Delta t_{0-1}=t_1-t_0$, $\Delta t_{1-2}=t_2-t_1$, etc., may correspond to a time duration, e.g., about 75 to about 100 microseconds, of a programming pulse applied to a page 310, according to the parameter values stored in the trim circuitry of commend execution logic 111 of FIG. 1. For one embodiment, the duration of a programming pulse is about 77 to about 95 microseconds.

For some embodiments, processor 120 checks the logic level of status signals 610 after a first number $R_1$ of programming pulses, e.g., about four pulses, to determine whether any of the pages are programmed. For example, pages $310_2$, $310_4$, $310_5$, and $310_6$ of FIG. 3, as respectively indicated by signals $610_2$, $610_4$, $610_5$, and $610_6$ of FIG. 6, are programmed by the first number $R_1$ of programming pulses, and correspond to a programming time of $\Delta T_{4-0}=t_4-t_0$ (FIG. 6). Note that pages may be programmed with fewer than the first number $R_1$ of programming pulses, and the corresponding status signals transition from the low to high logic level when the pages are programmed. However, processor 120 may not check the status until the first number $R_1$ of programming pulses is reached, so that any pages programmed in fewer than the first number $R_1$ are taken to be programmed in the first number $R_1$ or in a programming time of $\Delta T_{4-0}$. Note that a program-verify may be performed after each programming pulse to determine whether the pages are programmed. For one embodiment, one page is programmed and tested at a time. Once the page is programmed, another page is programmed and tested, etc.

If a page is not programmed by the first number $R_1$ of programming pulses, i.e., in a programming time of $\Delta T_{4-0}$, another programming pulse is applied to the page, and processor 120 checks the logic level of status signals 610 after a second number $R_2$ (=$R_1$+1) of programming pulses, e.g., about five pulses, to determine whether any of the pages are programmed. For example, pages $310_1$ and $310_L$ of FIG. 3, as respectively indicated by signals $610_1$ and $610_L$ of FIG. 6, have been programmed by the second number $R_2$ of programming pulses, corresponding to a programming time of $\Delta T_{5-0}=t_5-t_0$ (FIG. 6).

If a page is not programmed by the second number $R_2$ of programming pulses, i.e., in a programming time of $\Delta T_{5-0}$, another programming pulse is applied to the page, and processor 120 checks the logic level of status signals 610 after a third number $R_3$ (=$R_2$+1) of programming pulses, e.g., about six pulses, to determine whether any of the pages are programmed. For example, page $3103_3$ of FIG. 3, as indicated by signal $610_3$ of FIG. 6, is programmed by the third number $R_3$ of programming pulses, corresponding to a programming time of $\Delta T_{6-0}=t_6-t_0$ (FIG. 6). For one embodiment, if a page is not programmed by the third number $R_3$ of programming pulses or less, i.e., in a programming time of $\Delta T_{5-0}$ or less, the memory block is failed. Note that page $310_{L-1}$ of FIG. 3, as indicated by signal 6103 of FIG. 6, is programmed by a fourth number of programming pulses that is greater than the third number $R_3$ of programming pulses, corresponding to a programming time that is greater than $\Delta T_{6-0}$. However, such an occurrence will cause processor 120 to fail the memory block.

For another embodiment, if the number of pages programmed in a programming time of $\Delta T_{5-0}$ (or $R_2$ programming pulses) exceeds a first predetermined number, the corresponding block is failed, or the number of pages programmed in a programming time of $\Delta T_{6-0}$ (or $R_3$ programming pulses) exceeds a second predetermined number, the corresponding block is failed. This means that a block can pass with a first number of pages programmed in a programming time of $\Delta T_{5-0}$, a second number of pages programmed in a programming time of $\Delta T_{6-0}$, and the remaining pages programmed in a programming time of $\Delta T_{4-0}$ (or $R_1$ programming pulses) or less. For example, for one embodiment, the first number of pages may be up to about five, the second number of pages may be up to about two, and the remaining number of pages may be no less than about 59. Conventional programming schemes typically fail a block if a single page exceeds a single fixed programming time, whereas embodiments of the present invention pass a block having a few slower pages, while relying on the faster pages to compensate for the slower pages to generate an acceptable programming speed. This can help to increase yields during manufacturing.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of testing a memory device, comprising:
   programming a plurality of pages of a memory block;
   passing the memory block if a number of pages, each programmed in a first programming time, is greater than or equal to a first predetermined number and a number of pages, each programmed in a second programming time, is less than or equal to a second predetermined number; and
   failing the memory block if a programming time of any one of the pages exceeds a predetermined programming time or if the number of pages programmed in the first programming time is less than the first predetermined number or if the number of pages programmed in the second programming time exceeds the second predetermined number.

2. The method of claim 1, further comprising determining a programming time for each page.

3. The method of claim 2, wherein determining a programming time for each page is based on a number of programming pulses required to program that page.

4. The method of claim 1, wherein passing the memory block comprises allowing a number of pages, each programmed at a third programming time that is greater than the first programming time and less than the second programming time.

5. The method of claim 4, wherein the number of pages programmed at the third programming time is greater than the number of pages programmed in the second programming time and less than the number of pages programmed in the first programming time.

6. The method of claim 1, further comprising:
   determining the number of pages programmed in the first programming time; and determining the number of pages programmed in the second programming time.

7. The method of claim 6, wherein determining the number of pages programmed in the first programming time comprises determining the number of pages programmed by a first number of programming pulses, wherein determining the number of pages programmed in the second programming time comprises determining the number of pages programmed by a second number of programming pulses; and wherein failing the memory block if a programming time of any one of the pages exceeds a predetermined programming time comprises failing the memory block if any one of the pages requires more than the second number of programming pulses to be programmed.

8. The method of claim 7, wherein each programming pulse has a duration of about 75 to about 100 microseconds.

9. The method of claim 8, wherein each programming pulse has a duration of about 77 to about 95 microseconds.

10. The method of claim 7, wherein the second number of programming pulses comprises one more programming pulse than the first number of programming pulses.

11. A processor adapted to perform a method of testing each memory block of a memory device, the method comprising:
 programming a plurality of pages of a memory block;
 determining a programming time for each page;
 passing the memory block if a number of pages, each programmed in a first programming time, is greater than or equal to a first predetermined number and a number of pages, each programmed in a second programming time, is less than or equal to a second predetermined number; and
 failing the memory block if a programming time of any one of the pages exceeds a predetermined programming time or if the number of pages programmed in the first programming time is less than the first predetermined number or if the number of pages programmed in the second programming time exceeds the second predetermined number.

12. The processor of claim 11, wherein the method further comprises determining a programming time for each page.

13. The processor of claim 12, wherein, in the method, determining a programming time for each page is based on a number of programming pulses required to program that page.

14. The processor of claim 11, wherein, in the method, passing the memory block comprises allowing a number of pages, each programmed at a third programming time that is greater than the first programming time and less than the second programming time.

15. The processor of claim 14, wherein, in the method, the number of pages programmed at the third programming time is greater than the number of pages programmed in the second programming time and less than the number of pages programmed in the first programming time.

16. The processor of claim 11, wherein the processor is a part of a testing system or tester hardware.

17. The processor of claim 11, wherein the method is performed in response to the processor receiving computer-readable instructions stored on a computer-usable media.

18. The processor of claim 17, wherein computer-usable media is selected from the group consisting of hardware, software, and firmware.

19. The processor of claim 11, wherein the method further comprises:
 determining the number of pages programmed in the first programming time; and
 determining the number of pages programmed in the second programming time.

20. The processor of claim 19, wherein, in the method, determining the number of pages programmed in the first programming time comprises determining the number of pages programmed by a first number of programming pulses, wherein determining the number of pages programmed in the second programming time comprises determining the number of pages programmed by a second number of programming pulses; and wherein failing the memory block if a programming time of any one of the pages exceeds a predetermined programming time comprises failing the memory block if any one of the pages requires more than the second number of programming pulses to be programmed.

21. The processor of claim 19, wherein, in the method, the second number of programming pulses comprises one more programming pulse than the first number of programming pulses.

* * * * *